(12) United States Patent
Rhoads

(10) Patent No.: US 9,136,300 B2
(45) Date of Patent: Sep. 15, 2015

(54) NEXT GENERATION IMAGING METHODS AND SYSTEMS

(71) Applicant: Digimarc Corporation, Beaverton, OR (US)

(72) Inventor: Geoffrey B. Rhoads, West Linn, OR (US)

(73) Assignee: Digimarc Corporation, Beaverton, OR (US)

( * ) Notice: Subject to any disclaimer, the term of this patent is extended or adjusted under 35 U.S.C. 154(b) by 84 days.

(21) Appl. No.: 13/842,282

(22) Filed: Mar. 15, 2013

(65) Prior Publication Data

US 2014/0198240 A1    Jul. 17, 2014

Related U.S. Application Data

(60) Provisional application No. 61/751,787, filed on Jan. 11, 2013, provisional application No. 61/759,996, filed on Feb. 1, 2013.

(51) Int. Cl.
*H01L 27/146* (2006.01)
*H04N 5/225* (2006.01)
*H04N 5/232* (2006.01)
*H04N 5/369* (2011.01)

(52) U.S. Cl.
CPC .... *H01L 27/14647* (2013.01); *H01L 27/14625* (2013.01); *H01L 27/14634* (2013.01); *H04N 5/2253* (2013.01); *H04N 5/23212* (2013.01); *H04N 5/369* (2013.01)

(58) Field of Classification Search
None
See application file for complete search history.

(56) References Cited

U.S. PATENT DOCUMENTS

| | | | |
|---|---|---|---|
| 4,675,535 A * | 6/1987 | Tsunekawa et al. | 250/208.1 |
| 5,512,750 A | 4/1996 | Yanka et al. | |
| 6,593,558 B1 * | 7/2003 | Edgar | 250/208.1 |
| 2004/0125222 A1 * | 7/2004 | Bradski et al. | 348/272 |
| 2004/0178463 A1 * | 9/2004 | Merrill et al. | 257/440 |
| 2005/0087829 A1 * | 4/2005 | Merrill et al. | 257/440 |
| 2007/0218578 A1 | 9/2007 | Lee et al. | |
| 2008/0013941 A1 * | 1/2008 | Daley | 396/121 |
| 2009/0167924 A1 * | 7/2009 | Raschke et al. | 348/345 |
| 2010/0157117 A1 * | 6/2010 | Wang | 348/276 |
| 2010/0276736 A1 | 11/2010 | Bocko et al. | |
| 2011/0242389 A1 * | 10/2011 | Takatsuka et al. | 348/311 |
| 2012/0200726 A1 * | 8/2012 | Bugnariu | 348/222.1 |
| 2012/0242867 A1 * | 9/2012 | Shuster | 348/240.2 |

FOREIGN PATENT DOCUMENTS

| | | |
|---|---|---|
| WO | WO 2010044826 | 4/2010 |
| WO | WO2014110484 | 7/2014 |

OTHER PUBLICATIONS

PCT International Search Report and Written Opinion of the International Searching Authority, PCT/US2014/011236 (published as WO2014110484), mailed Aug. 25, 2014.

* cited by examiner

*Primary Examiner* — Jason Flohre
(74) *Attorney, Agent, or Firm* — Digimarc Corporation

(57) ABSTRACT

The advent of electronic-based imaging generally followed the four generalized 'eras' identified in FIG. 16 The trend is clearly toward higher and higher levels of integration for the act of "taking pictures." FIG. 17 is a humble graphic attempt to summarize certain aspect of the present technology, and how a synthesis of these additional technical capabilities can represent a next era quite nicely. To the extent a great deal of past photography and filming has involved the mastery of technical limitations and turning limitations into art, a new challenge should develop where everyone has their own pocket Hasselblad/Steadicam, and exploration of new subject matter becomes the game.

21 Claims, 11 Drawing Sheets

Sensor/Camera Evolution

- Era 1: Analog Sensor, 1970 - 1990
  - A/D everything else off-chip
- Era 2: Digital CCD's & CMOS, 1990's early 2000's
  - Digital data, often compressed, exits chip
- Era 3: System on Chip Sensors, mid 2000's – present
  - Getting processing gates onto the sensor, still & video merging
- Era 4: Wafer-Level-Cameras late 2000's – present
  - Personal devices

NEXT GENERATION IMAGING METHODS AND SYSTEMS

RELATED APPLICATION DATA

This application claims priority to provisional applications 61/751,787, filed Jan. 11, 2013, and 61/759,996, filed Feb. 1, 2013

FIELD OF TECHNOLOGY

The present technology relates to camera systems.

BACKGROUND AND INTRODUCTION

Foveon, Inc. (now Sigma Corporation) produces image sensors comprising an array of photosites, each of which includes three vertically-stacked photodiodes. Each of the three photosites responds to different wavelengths of light (i.e., each has a different spectral sensitivity curve). The Foveon technology is detailed, e.g., in U.S. Pat. Nos. 6,727,521, 6,731,397, 6,841,816, 6,958,862, 6,998,660, and 7,339,216.

Lytro, Pelican Imaging and others produce light field cameras that capture 4D light field information about a scene, through use of microlenses. Such "plenoptic imaging" systems are detailed, e.g., in patent publications 20070252074, 20080131019, 20080266655, 20100026852, 20100265385, 20110069189, 20110080487, and 20110122308.

Various companies have developed transparent semiconductors, transistors and electrodes useful in CMOS image sensors. Exemplary technology is detailed in Samsung's patent applications 20110156114 and 20090101948. Familiar transparent electrode materials include tin-doped indium oxide, zinc oxide, and carbon nanotube films. Additional information is provided in Ginsley, et al, Handbook of Transparent Conductors, Springer, 534 pp., 2011.

The artisan is presumed to be familiar with technologies involved in fabrication of semiconductor image sensors, including the foregoing.

In accordance with one aspect of the present technology, photosensors are again stacked. However, the stacking is considerably thicker than the prior art, making possible camera sensors that provide multi-focal length imaging, e.g., between six inches and infinity.

FIG. 1 introduces certain concepts used in the technology. Plural layers P1-P8 are stacked in an integrated structure, behind a lens system. Each layer comprises one or more photodetectors. The distance of each layer behind the lens corresponds to a different object distance, in accordance with the focal length of the lens. (I.e., the reciprocal of the object-lens distance, plus the reciprocal of the photodetector-lens distance, equals the reciprocal of the lens focal length.)

An image sensor can comprise a 2D array of such stacks, as illustrated schematically in FIG. 2.

The foregoing and many other features and advantages of the present technology will be apparent from the following detailed description, which proceeds with reference to the accompanying drawings.

DETAILED DESCRIPTION

Figure 3:
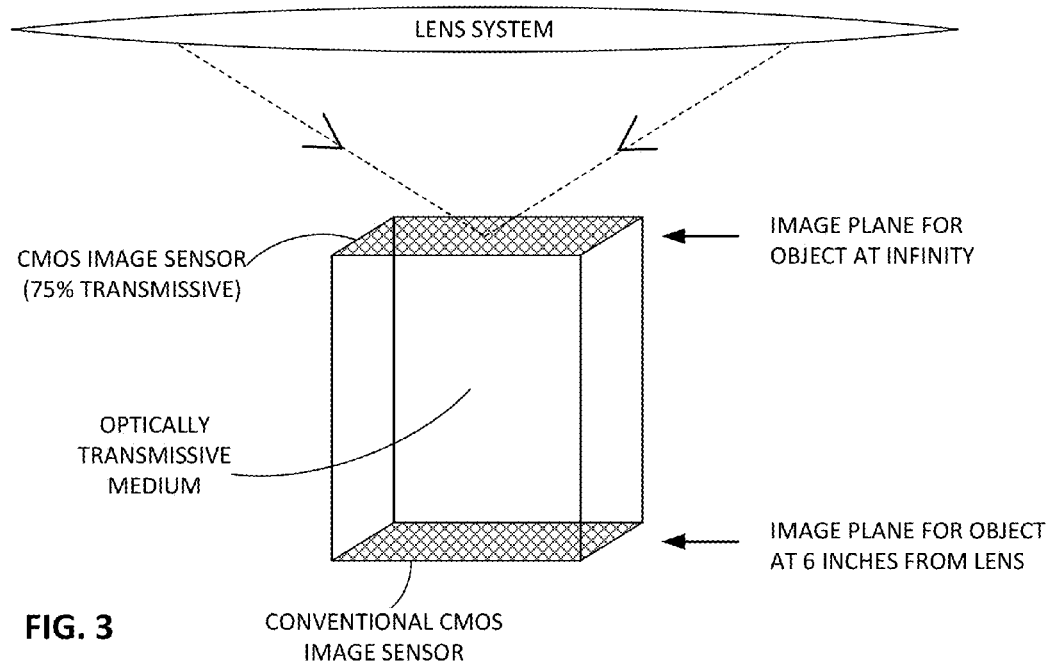
FIG. 3 shows a basic implementation using two stacked image sensors.

FIG. 3 shows a first particular embodiment, including first and second stacked image sensors, and a lens system. The first sensor is at an image plane corresponding to an object at an infinite distance from the lens system; the second sensor is at an image plane corresponding to an object at a distance of six inches. The two sensors have the same pixel dimensions (e.g., 1936×2592 pixels).

The first sensor is fabricated to pass at least some of the light incident on its top surface through its structure, and on towards the second image sensor. Such transmissivity can be achieved by appropriate design and fabrication of the charge transfer conductors and associated readout circuitry, so that some light passing through the photodetection region is not blocked by such structures. For example, the structures may be sized and placed so that gaps between them allow for the passage of some light. Some of the circuitry may be positioned to the periphery of the sensor—where light passage is not an issue. Still further, some of the conductors/circuitry can be fabricated using optically-transparent materials.

In the illustrated embodiment, the top sensor absorbs 25% of the incident light, and passes 75%. But this number is not critical. Even if it passed a tenth of this amount or less (e.g., 5%), advantageous results associated with the FIG. 3 arrangement would still be realized.

Light passing through the first sensor enters an optically transmissive medium. The thickness of the medium depends on the range of focal distances to be accommodated. An exemplary thickness for this medium is 100 microns, but depending on particular application requirements this thickness may be as small as 10 microns, or as large as many hundreds of microns.

The medium can comprise various materials. Air is attractive for certain optical properties. However, interfaces between air and other optical materials are sometimes disfavored. Another suitable medium is glass. Another is a semiconductor. Still another is a fluid. Combinations can, of course, be used.

Light exiting this medium is incident on the second image sensor. This second sensor can be conventional in structure.

When a subject is at an infinite distance from the lens, the lens presents a focused image on the top sensor. Very high resolution sampling of this image is achieved by the top sensor (in accordance with the sensor's physical resolution).

Part of that focused light energy on the top sensor from the infinite-distance object passes through the first sensor, and through the intervening medium, and falls on the second sensor. There the image is no longer focused. The strong edges and contrasts that are associated with a focused image are lost. A very low contrast, highly blurred image results.

For an object at six inches distance from the lens, the situation is reversed. The lens casts a focused image on the bottom sensor (albeit with some of the light absorbed by its passage through the top sensor), yielding high resolution image data from the bottom sensor. At the top sensor, in contrast, the image is out of focus—with low contrast.

Not shown in FIG. 3 is an ancillary system that collects data output from the two image sensors, and makes them available for post-processing. In one mode, this post-processing can comprise simply adding output signals from corresponding pixels in the first and second sensors, yielding a frame of output image data having the same dimensions as the image data from the first and second sensors. (The output signals from the first sensor may be scaled by a factor of three to compensate for the fact that the bottom sensor receives three times the light absorbed by the top sensor.)

Figure 3A:
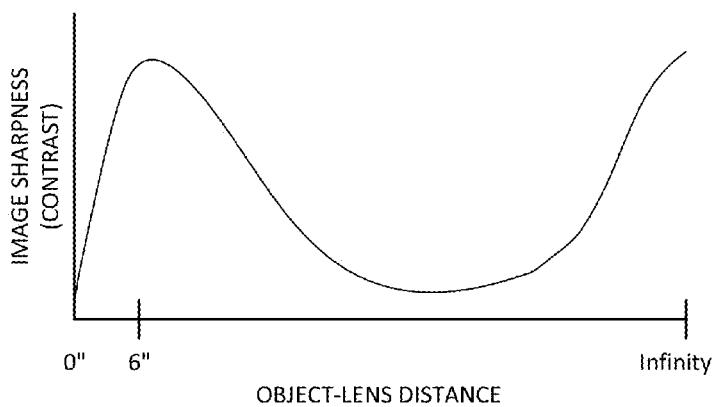
FIG. 3A shows an image sharpness curve for the implementation of FIG. 3.

If the post-processing operation adds the images from the first and second sensors, an image sharpness curve like that shown in FIG. 3A results. At an object distance of six inches, maximally-sharp imagery is output by the second sensor. The first sensor, however, outputs a maximally-blurred image in this situation—contributing a low contrast noise signal.

At distances greater than six inches, the image output by the second sensor becomes increasingly blurred—reducing the net sharpness of the combined output signal.

As the object distance approaches infinity, the sharpness of the image output by the first sensor increases—until its maximum value at infinity. Again, a low contrast noise signal is contributed by the other (second) sensor, which outputs maximally-blurred imagery for an object distance of infinity.

Figure 4:
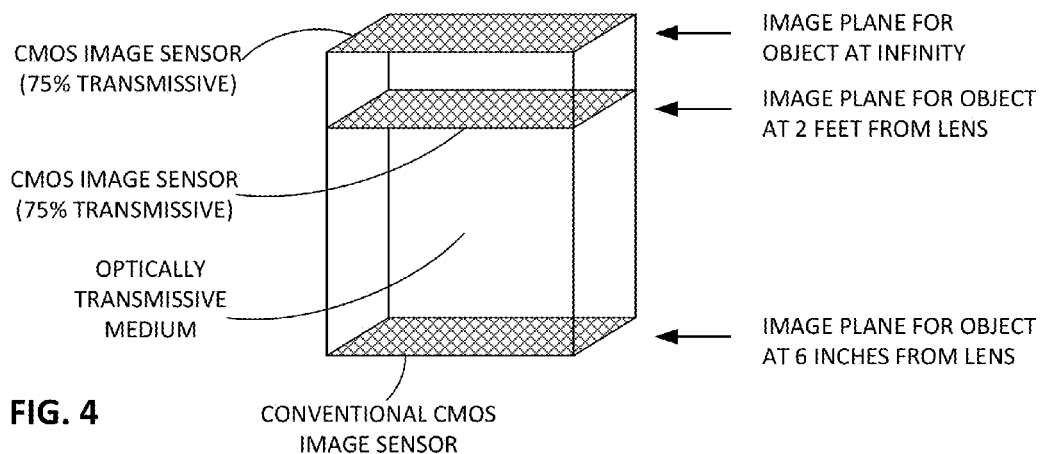
FIG. 4 is similar to FIG. 3, but shows four stacked image sensors.

The just-discussed principles can be extended to any number of stacked photosensor arrays. FIG. 4 shows an arrangement employing three arrays. Again, the top and bottom sensors are positioned to capture focused images from objects at distances of infinity and six inches, respectively. However, the FIG. 4 arrangement includes a third sensor array positioned to capture focused imagery from objects at a distance of two feet.

The design of this third photosensor array can be similar to that of the top array, e.g., transmissive of part of the incident light (e.g., 75%). In this arrangement, approximately 50% of the incoming light is absorbed before being passed to the CMOS sensor at the bottom of the stack.

This arrangement produces a curve akin to FIG. 3A, but with three humps rather than two.

It will be noted that the third photodetector array in FIG. 4 is closer to the top sensor than the bottom sensor. Yet the top two sensors collect imagery from the largest range of focal distances, i.e., two feet to infinity. This is a consequence of the lens equation.

Figure 5:
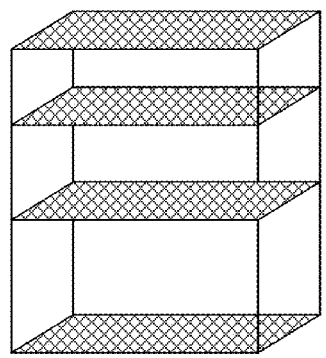
FIGS. 5-8 show other variants employing stacked image sensors.

FIGS. 5-8 illustrate still other stacking variants. FIG. 5 shows four sensor arrays. Like FIG. 4, the spacing of the arrays within the stack is non-uniform.

Figure 6:
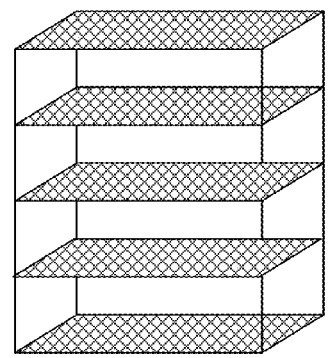

FIG. 6 shows a stack of five sensor arrays—this time with uniform spacing through the stack.

Figure 7:
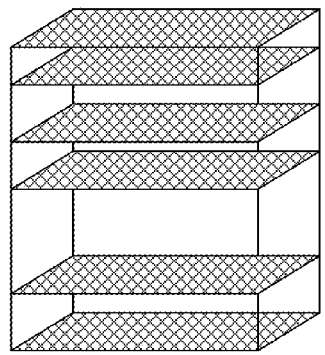

In some arrangements, such as FIG. 7, the sensors can be spaced in a random fashion.

Figure 8:
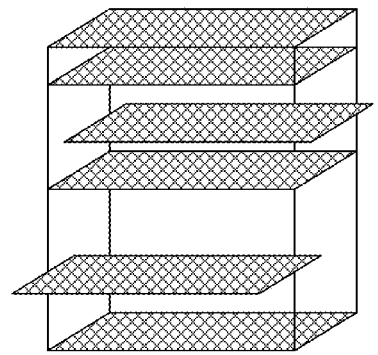

FIG. 8 illustrates that in all such stacked-sensor embodiments, precise alignment of the sensors is not required. Any mis-alignment between sensors can be detected after fabrication (e.g., by analysis of test imagery), and compensated-for in post-processing.

Nothing has yet been said about color. The human eye is much more sensitive to luminance (brightness) than color. Accordingly, color typically needn't be resolved as finely as luminance for most purpose. (For example, an image sensor with a million photosensor cells may produce only 250,000 samples of red information, and a like number of samples of blue, using a Bayer color filter.)

In the embodiments of FIGS. 3-8, the bottom photosensor in the stack can employ a Bayer color filter for sampling red, green and blue at different photosites. The upper sensors can include a regular or random distribution of color filters as well, which may be sparse (i.e., some photosites have no filter).

Figure 9:
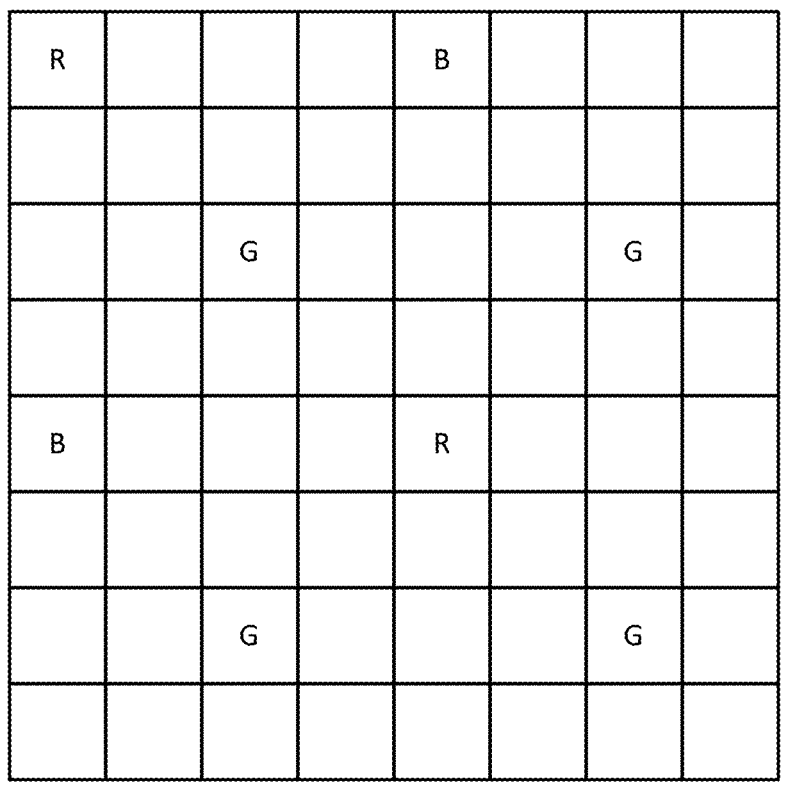
FIG. 9 shows a sparse color filter array.

FIG. 9 shows one form of sparse, regular color filter array, which may be tiled across the top image sensor in FIG. 3, or across the top and intermediate image sensors in FIG. 4. (In the latter case, the color filters on the sensors may be spatially staggered relative to each other.) In the depicted color filter array—as with the conventional Bayer pattern—green is sampled twice as frequently as red and blue. A variety of other such patterns, including some that are denser and some that are sparser, are straight-forward to implement.

In a variant embodiment, the component stacked photosensors can produce color information through use of Foveon-like technology. However, if a conventional Foveon sensor is used top the stack, then no light would penetrate to lower layers. One approach is to fabricate a sparse array of Foveon sensor pixels—interspersed with clear pixels. This enables passage of some of the incident light through the clear pixels to lower layers.

Second Class of Embodiments

The arrangements detailed above involve, conceptually— if not necessarily physically, a mechanical configuration of parts. In more sophisticated embodiments, a stacked photosensor structure is achieved in integrated fashion, using familiar semiconductor fabrication techniques (deposition, masking, lithography, doping, etc.).

Returning briefly to FIG. 1, imagine that each of the layers P1-P8 is a volume of a semiconductor material, into which one or more photosensitive regions has been formed. Such an arrangement is shown in the exploded view of FIG. 10, in which the photosensitive regions (sometimes terms photosites) are shown by ovals. Physically, these ovals are three-dimensional in character—akin to M&M candies in configuration—encompassing a junction between a P-doped region and an N-doped region, and a depletion zone through which photo-electrons can be routed for collection (e.g., to charge-accumulating capacitors—not shown).

(In a different arrangement, the depicted ovals are physically realized by component structures that extend a greater distance in the vertical direction than in the horizontal.)

This second class of embodiment permits the size and placement of the photo-electron generating and collecting structures to be tailored as desired, e.g., to optimize quantum efficiency, achieve particular sampling objectives, etc.

For example, within the various layers along the Z-axis, the photosites can be spatially staggered (i.e., in the X-Y plane) to limit vertical occlusion of one by the other.

Figure 11A:
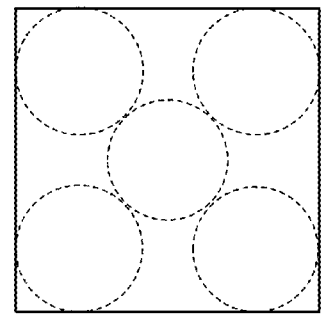
FIG. 11A show how the various photosites in the FIG. 10 arrangement may spatially relate, when viewed down through the stack.

FIG. 11A shows one pattern of photosites—looking down through the stack along the Z-axis. (Only five photosites are shown, for clarity of illustration.) The photosites are symmetrically spaced within the X-Y boundaries of the stacked column. If each photosite absorbs 100% of the photons propagating vertically down through the stack that encounters the site, the depicted FIG. 11A arrangement would absorb 68% of the total electrons. That is, 68% of the X-Y area is occupied by photosites.

Figure 11B:
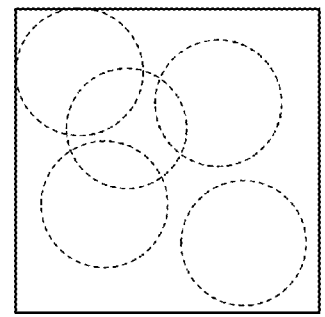
FIGS. 11B and 11C are similar to FIG. 11A, but illustrate other spatial relations.

Other arrangements can, of course, be employed. FIG. 11B shows that the photosites in the different layers can be placed in random fashion in X-Y. Although this leads to lower quantum efficiencies, the stochastic sampling thereby effected has other desirable properties.

Figure 11C:
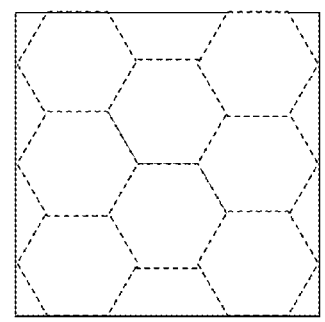

The photosite regions needn't be circular in aspect. FIG. 11C shows how hexagonal photosites can be employed—yielding still greater photon capture and efficiency.

Figure 10:
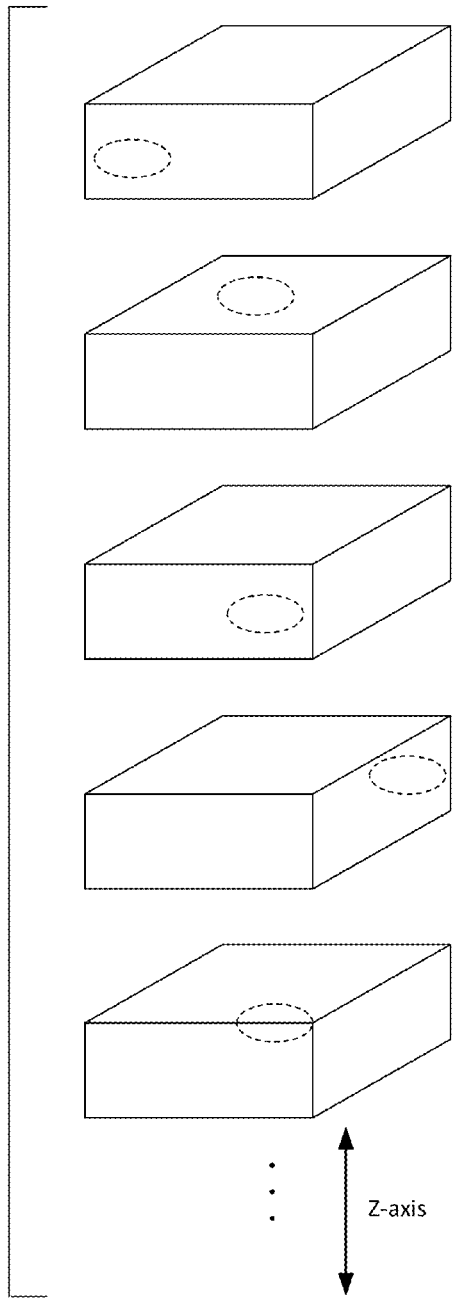
FIG. 10 illustrates how photosites in different layers of a stack can be at different positions in the layers.

In a particular arrangement, the FIG. 10 stack is 10 microns on a side, and the photosites have diameters of 1.75 microns. The total stack depth depends on the desired focal range; a stack depth of 100 microns is exemplary. (This roughly corresponds to a common smartphone configuration, which uses an f2.0 lens, spaced 3.85 mm from the sensor array, and provides a focus range of six inches to infinity.)

Continuing with the M&M analogy, the photosites may be of different colors. More accurately, they may have different spectral responses. A simple starting point is to provide each photosite with either a corresponding red, green or blue filter, so that it responds to photons only of the associated wavelength.

Figure 2:
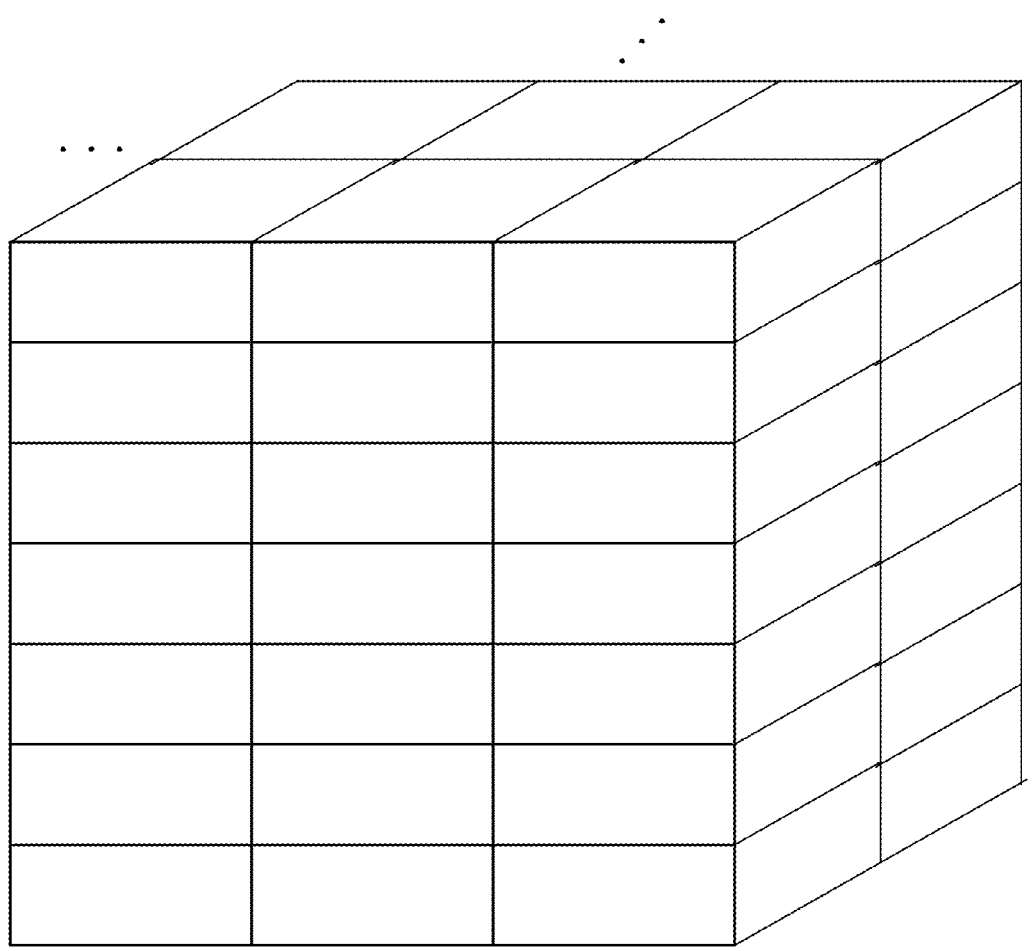
FIG. 2 shows an array comprising a 2D array of the stacks of FIG. 1.

While that's a simple conceptualization of the idea, placement of color filters within an integrated circuit complicates its fabrication. Another approach to making different photosites responsive to different spectra is by the phenomenon popularized by Foveon—doping the semiconductor so that photons of different energies are more likely to penetrate to (and be detected in) different depths of the photosensor structure. Different doping can be used in different of the FIG. 2 stacks, so that across a given X-Y plane of the structure, different regions are attuned to different light frequencies. (That is, at a depth of 56 microns, not all photosites are maximally responsive to the same wavelength of light.)

Still another approach to making different photosites respond to different spectra is through use of dichroic mirrors or filters. Put simply, a frequency-selective mirror (thin film-based) can be fabricated under a photosite. If a quantum of light passes the photosite without dislodging a photo-electron, it next encounters the thin film structure. The dimensions of this structure are chosen to induce a reflection of certain wavelengths of light. Such light is reflected back towards the photosite it just passed (i.e., vertically, up through the stack)—giving this quantum of light a second chance to kick a photo-electron out of the semiconductor material in that photosite.

Yet another approach to realizing photosites having different spectral selectivities is through use of quantum dot material. Work at MIT's Tisdale Lab, at Delft University, and Invisage, has demonstrated use of quantum dot and film materials in image sensors. Related work is detailed, e.g., in Prins et al, Fast and Efficient Photodetection in Nanoscale Quantum-Dot Junctions, Nano Letters, Vol. 12, No. 11, October, 2012, pp. 5740-5743; Konstantatos et al, Solution-Processed Quantum Dot Photodetectors, Proc. IEEE, Vol. 97, No. 10, pp. 1666-1683, October, 2009; and in patent publications U.S. Pat. Nos. 7,476,904, 20070132052, 20110101205, 20110226934, 20100187404, and 20130032782.

A particular implementation employs quantum dot material to transduce photons in the visible region into a short burst (e.g., nanosecond-scale burst) of electron/exciton energy, which is then measured and correlated to wavelength of the existing photon.

In one illustrative embodiment, such quantum dot transducers (with a scale of 2-20 nm) are distributed in a sensing volume 100 microns in thickness. Each quantum dot effectively serves as a photon-transduction pulser, with the pulse size (strength) correlating to incoming photon wavelength (i.e., color). Depending on implementation, there may be thousands of such dots per square micron through the device. The pulses may be quantized (desirably near the sites) to 6- or 8-bits of resolution.

While imaging science has long been fixated on tri-color systems (red/green/blue, and cyan/magenta/yellow), such arrangements optically pale in comparison to the capabilities of the human vision system. Better is to employ a richer spectral vocabulary. Thus, the spectral responses of the photosites employed in the present technology desirably are of more than three types (although in certain embodiments, single-, two- or three-spectral responses can be used). Four is on the low side. Different spectral responses numbering eight or more are be preferred.

In this regard, reference is made to copending application Ser. No. 13/840,451, filed Mar. 15, 2013. It details, e.g., how multiple different (sometimes complex) spectra can be used to illuminate an object, so as to permit the object's spectrometry to be assessed more accurately than is possible with conventional R/G/B technology. In like fashion, use of multiple different spectral sensitivities by different photosites in the present technology similarly enables color imaging that exceeds the limitations of traditional tri-color systems.

Five years from now, smartphones desirably will include both the technology detailed in the just-cited application, and the sensor technology detailed herein.

Returning to and stretching the M&M analogy a bit, the electrons collected by the various photosites need to be routed for collection—typically by charge-storage capacitors (which may be formed at the bottom of the sensor array—beneath the last photosensitive regions). This routing can be effected by conductive electrodes (vias) that pass—typically vertically—through the integrated structure. In some implementations, these conductive electrodes are bundled—forming trunk-like structures. In such case, the M&M photosites may be regarded as leaves on branches (horizontal electrodes) that extend from this vertical trunk.

Transparent electrode materials can be used to limit absorption of light within the bulk of the structure. Nanowires can be employed for the vertical vias in the photosensor array. (See, e.g., Fan et al, Electrical and Photoconductive Properties of Vertical ZnO Nanowires in High Density Arrays, Applied Physics Letters, Vol. 89, No. 21, 2006; and patent publications 20070155025 and 20110315988.)

Figure 12A:
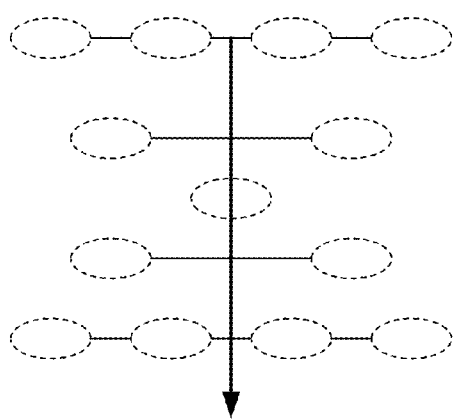
FIGS. 12A and 12B show different tree structures, by which photosites can be arranged relative to charge-conducting electrodes.
Figure 12B:
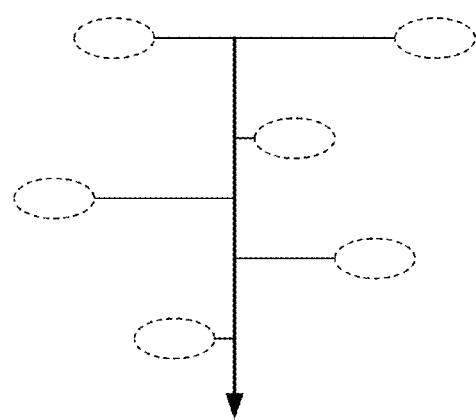

FIGS. 12A and 12B illustrate the concept of such a tree. The trunk (comprising plural conductive vias) is represented by the darker vertical line. Photosites are coupled to the component electrodes of the trunk, for routing of their photo-electrons to charge-storing capacitors. FIG. 12A shows a regularly-arranged configuration. FIG. 12B shows one with more randomness.

These figures, of course, show only two dimensions. It will be recognized that additional photosites can exist in the third dimension, and can be similarly coupled to the tree trunk.

Note, too, that the number of photosites in each layer of the tree can be different. The photosites within any X-Y layer needn't be regularly and uniformly distributed. Some regions of a layer may be locally dense with photosites, while others can be relatively sparse. As with other design choices, application constraints will commonly dictate such details in any particular embodiment.

Although not shown in FIG. 10, a conventional image sensor (e.g., CMOS or Foveon) may be formed—or affixed—at the bottom of the integrated photo sensor stack, to collect any remaining photons not transduced by the photosites throughout the volume.

Returning to FIG. 1, the illustrated light rays captured from nearby "Object 2," and focused by the lens down into zone P7, first pass through all of zones P1-P6. The artisan will recognize that such light can kick-out photo-electrons in any of these zones P1-P6, on its way to P7.

Moreover, while the light rays converge in zone P7, they may pass through even that zone, and end up kicking-out photo-electrons in zone P8.

Thus, all of the component zones may output electron charge due to light from Object 2. However, the electron count produced by zone P7 will exceed that from any of the other zones, due to the increase in the electric field near the focal zone.

Further Information on Blur and Sampling

Additional technical insight into the present technology may be gained by examining the important difference between what is popularly called "blur" on the one hand, and what may be called Explicit Angular Sampling, or just angular sampling.

One might say that blur is a physical phenomenon that has rather strict "depth of field" implications—primarily driven by the classic f-number of a lens being used, while angular sampling happens to be a core design principle of most embodiments of this technology, and helps explain why classic depth of field challenges can be overcome.

It is exceedingly well known in signal sampling theory and practice that the discrete sampling of a signal (one dimensional, two, or even three) needs only be slightly finer that the local undulatory properties of a signal (expressed deliberately in lay terminology to make the point). More colloquially, if it wiggles, sample it at three to five points per wiggle, and you should be fine. More technically, whereas Nyquist suggests that taking only two discrete samples per cycle of the highest frequency of a signal may suffice, engineering practice suggests a slight "oversampling" of a signal is desired for good measure, as it were.

Keeping the underlying issues still high-level (intuitive and even slightly pedestrian if the reader is a trained optical engineer), let us look at a simple scenario: a 4 millimeter focal length smart phone camera with an f2 aperture, or 2 millimeter aperture. We can further assume that the best focus "spot size" for a focused point is 2 microns. Simple ray-theory depth of field arguments tell us that for every 4 microns a sensor travels away from the "best focus" plane, the spot size will grow by 2 microns. Thus by 10 microns or so out of focus, the "spot size" of a point has grown to 5 microns. Optical engineers may rightly cringe at this over-simplification of "depth of field," but please tolerate the desire here to just point out that "blur" can happen very easily in modern smart phone cameras even with 10 to 20 micron out-of-focus conditions. 10 to 20 microns matter.

So continuing on with the pan-audience ray-trace storyline, once a typical f2 lens and planar-sensor is say 40 microns "out of focus," the "blur circle" as it is often called has grown to be 20 microns, 10 times worse than the pristine 2 micron tight-focus capability of the lens. Wiggle-wise, wiggles with ten times less detail need only have ten times sparser sampling, hence any pixels at 2 microns are ludicrously oversampling these "blurred" signals at this out-of-focus plane. In a nutshell, the conventional planar approach to image sampling inherits this rather stark depth-of-field phenomena and the culturally-ingrained idea of focus and blur (lack thereof).

Enter the third dimension of a sensor and the simple notion of sprinkling photosites at various depths inside a sensor, rather than simply in one plane (or three thinly packed planes for color sampling a la RGB and Foveon). In short, distribute 2 micron-ish photosites at various depths of a sensor from the front surface all the way to the furthest optically active surface, typically over a 100 micron thickness at least for a smart phone camera (4 mm, f2 or f2.8). As noted, give these 3D splayed photosites various spectral selection properties while you're at it, no need to rigidly adhere to RGB models only (though adhering to these models is acceptable as well).

Nature's Teachings: Light Detection is a 3D Quantum Affair, not a 2D Sampling

Nature has provided us the examples of the faunal retina and the floral chlorophyll for study of light to energy transduction in general. Let's roll with that.

The closest engineering approach perhaps would be to view pixels not as photosites per se, but as micro-waveguides very much borrowing on rod/cone principles and chlorophyll-molecular-chain principles for more efficient photo-electron production. The 10 micron by 10 micron vertical cell cavity arrangement (FIG. 10) with "trees" of active photosites are near the same physical scale as single-mode optical fiber, and thus lend themselves very well to electromagnetic field modeling in the extreme details of semi-conductor and/or "nano-tech material deposition" engineering of both the vertical structures as well as the individually active photo-electron generation sites.

Another well-known prior art which is general 2-dimensional in its primary application, but can be adapted easily to three dimensions, is the "dichroic filter." As noted, controlled layering of differing substances with differing optical densities, especially at the 1-2 micron scales of the optical photosites, can be an extra widget in the design toolbox as the spectral selection properties of these photosites is determined.

Moveable Sensors

In accordance with a further aspect of the present technology, a sensor in a smartphone or other such video camera system is disposed on a moveable mount, permitting motion of the sensor relative to the rest of the optical assembly (e.g., the lens).

Moveable lenses, sensors, and camera mounts have previously been employed for mechanical image stabilization, and such teachings can be employed in embodiments of the present technology. But the aim of the present technology is somewhat different.

For example, prior art mechanical image stabilization, as used in video cameras and film motion picture cameras, has largely sought to keep static features of a scene at consistent locations, frame to frame—despite unintended movement of the camera (e.g., caused by hand jitter).

When a video camera is moved in a deliberate fashion, e.g., in a panning motion, then arrangements like that marketed under the Steadicam brand are sometimes used to stabilize the camera mount (i.e., the lens and sensor together). This type of stabilization tends to isolate the camera from the operator's undesired, high frequency, movements. More uniform motions, however, such as panning, are not counter-acted by such arrangements.

Contemporary versions of Steadicam-like arrangements employ MEMS-based rate gyrosensors mounted to a gimbaled camera rig, to measure the angular rate of the camera's rotation. Signals from these gyrosensors are used to drive DC servomotors, coupled to the camera's rotational axes, to effect compensatory motions.

The present technology again contemplates panning, or other deliberate movements of the camera. But instead of mitigating motions that are ancillary to the desired movement (as with the above Steadicam-like arrangements), the present technology acts in concert with the desired movement, to reduce frame motion blur caused by such desired movement.

Consider the case of a pan (i.e., a rotation of a video camera around a vertical axis), in which the video camera captures a frame of imagery every thirtieth of a second. (The exposure interval of each frame may be 30 milliseconds, and 3.33 milliseconds may elapse between frame exposures.)

If the camera is panned at a rate of six degrees per second, then each successive frame depicts a view through the lens that is advanced, relative to the prior frame, by an increment of 0.2 degrees. This horizontal change in the viewed scene causes an apparent movement of fixed image features across the sensor, also in a horizontal direction. If the camera lens has a field of view of 30 degrees, and projects the imaged scene onto a sensor having 480 columns of pixels, then each degree of view corresponds to 16 columns. From one frame to the next, the 0.2 degree change in camera orientation corresponds to a horizontal shift of about 3 columns of pixels.

In accordance with one embodiment of the present technology, a MEMS or piezo-electric actuator linearly shifts the camera sensor a horizontal distance of 3 pixel columns during the exposure of each of the frames—to counteract the panning-induced movement of the image on the sensor during that exposure period. At the end of the exposure period, the actuator quickly re-traces its travel in an opposite direction, to prepare for exposure of the next frame. This process repeats for each frame, so that the sensor alternately tracks the movement of the panning image, and then pops back to its original position. This operation may be termed a "track-pop" cycle.

Figure 13:
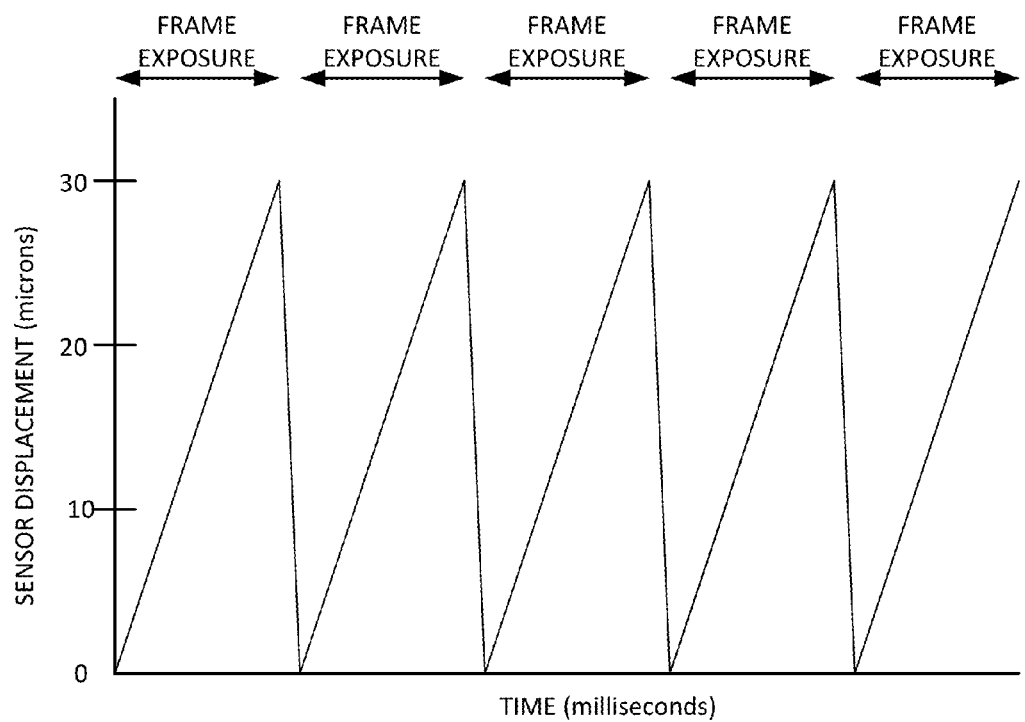
FIG. 13 is a diagram illustrating movement of a smartphone sensor as a function of time.

FIG. 13 shows the movement of the camera sensor in a horizontal dimension as a function of time. The illustrative sensor has a horizontal dimension of 4.8 millimeters, so that each pixel row is 0.01 millimeters across (i.e., 10 microns). During the course of a single exposure interval, the sensor is moved three pixel rows, or 30 microns. In the brief interframe interval, the actuator pops quickly back to its original position.

Figure 14:
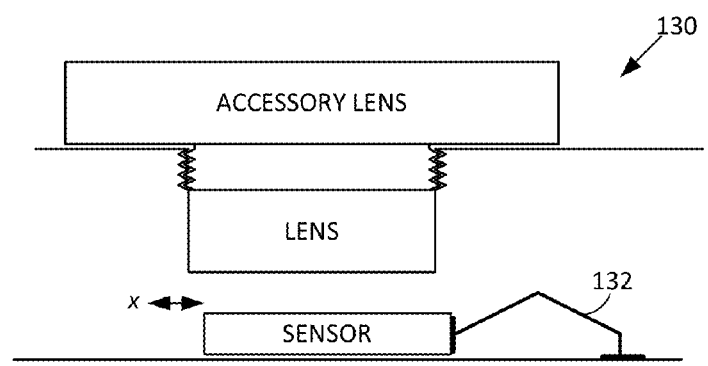
FIG. 14 is a schematic illustration of part of a smartphone camera system according employing certain aspects of the present technology.

FIG. 14 (not to scale) schematically shows a section view through part of a smartphone. A lens is positioned above an image sensor. The exterior surface of the lens terminates at a threaded opening into which an accessory lens (e.g., for additional light capture, or for microscopy) can be installed. The lens may include an auto-focus actuator (not shown) that mechanically moves the lens towards or away from the sensor. (If an image sensor of the sort described earlier is employed, then such mechanical focus arrangement is not needed.)

The sensor is mounted for movement by a MEMS actuator 132, which can translate the sensor towards or away from the actuator. The actuator may provide a range of motion of 50 microns, on each side of the sensor's nominal position (i.e., aligned with the lens.)

It will be recognized that the foregoing description is necessarily simplified, for expository convenience. In actual practice, for example, the sensor may be translated in two directions, e.g. in "x" and "y." Two actuators can be used for this function, or a single, 2D actuator, can be employed. (An example of the latter, using comb electrodes that are controllably excited to move optical elements in two dimensions, is detailed in U.S. Pat. No. 6,914,710.)

Horizontal panning was assumed in the foregoing example. More generally, the nature of camera movement (e.g., angular panning, linear translation, etc.), and associated movement parameters, are desirably sensed by one or more 3D accelerometers and gyroscopes. Camera movement data can also be discerned from image sensor data, e.g., by tracking movement of scene features in the camera's field of view. Signals output from one or more such sensors are provided to the device processor, which computes the direction, magnitude, and timing of sensor movements that are needed to counteract motion of the image across the sensor during a frame exposure. Corresponding control signals are then sent to the sensor actuator(s).

More particularly, movement of the camera and/or movement of dominant subject matter in a scene both give rise to gross lateral shifts of the light fields falling on a sensor. The dynamic X-Y re-positioning of the sensor attempts to track, as best as possible, the global average of this shift. Desirably, these shifts are sensed, and used to generate appropriate control signals.

One approach is to utilize the now quite ubiquitous MEMS gyroscopes and accelerometers in order to determine the general movement characteristics of a camera on a frame-by-frame timescale. If one infers that a scene is largely not changing, the drive signals applied to the MEMS actuators can simply be an inversion of these measured movements of the camera. A second approach, which can be utilized separately or in combination with the first approach, is to use acquired pixel data from the sensor itself to measure and infer "residual tracking motion," for lack of a better term. In other words, it is a known prior art to determine the direction and extent of "motion blur: in a given image, providing for a measured value which after two such frames of such motion blur, can be used to assist in forming the drive signals for the MEMS track-pop actuation signals.

While the foregoing technology is described with reference to linear translation of the image sensor, in other embodiments different sensor movements can additionally, or alternatively, be employed. For example, the plane of the sensor may be tipped and/or tilted, so that its surface normal is non-parallel to the axis of the lens. Similarly, the sensor may be twisted (rotated) along its surface normal axis.

It will be recognized that the physical movement of the sensor needn't precisely counteract the movement of the image projected onto the sensor. Any similarity between such motions is an improvement over none. Likewise, while the exemplary embodiment included a 3.33 millisecond interval between exposures, during which interval the sensor popped back to its original position, this is not essential. The pop-back of the sensor to its original position can occur during the exposure. Due to the brevity of such movement, and the relatively small distance traveled, the consequent impairment of image quality may be acceptable in certain applications.

Additional Details Re Light-Field Tracking MEMS

Companies such as Digital Optics Corporation and Tessera Technologies, Inc., among others, currently commercially supply MEMS-based Auto-Focus (AF) devices which provide the Z-axis displacement mechanism between a lens and a 2D sensor. As noted, aspects of the present technology posit use of such MEMS devices to also mechanically actuate motions in both the X and the Y direction: sensor plane relative to the plane of the lens. That is, the sensor would controllably shift at near 1-micron-level resolution relative to the parallel planes of the lens and sensor.

Current MEMs AF device specifications are nicely close to the specifications useful required for track-pop imaging cycles. In particular, full range actuation distances approaching 100 microns or even more are desirable, as will be discussed. Likewise, half-range movements in the single digit millisecond range and preferably even better are desirable, though as will be seen, a track-pop cycle program can be adapted to the specifications of whatever a given physical MEMS device can provide.

One aspect of track-pop cycling is to extend the prior art MEMS actuation from one axis to three. One way to do this is to do what many laboratory optical scientists do with much larger actuation stages than MEMS, and that is to simply bolt on a single actuation stage onto a second one but at an orthogonal manner, where the actuation of one stage moves the entire second stage along one given axis, then the second "riding" stage can then move a third body in some orthogonal direction, where that third body become yet a third MEMS actuation stage oriented "push axis" along the remaining orthogonal direction in 3-space (orthogonal to both of the first two stages). This long winded description mirrors the klunkiness and costliness of this approach, but it is important to note that this solution will unequivocally work.

A preferred approach to building 3-axes MEMS devices is to drive toward "close" to the same packaging form factor and dimensions of the current class of AF MEMS devices. The micron-level comb and spring structures currently laid out on nicely planar structures for 1-D AF have to "break the plane" at least in a higher level of assembly, if not at the raw manufacturing level. (In other words, individual one-axis MEMS actuation likely will still be manufactured as a 1-D actuation-axis structure, but it will need to be more finely sliced up, twisted and then re-assembled orthogonally with its identical or nearly identical siblings (other uni-axis actuators). One approach to doing this is to start with a current Z-axis (focus axis) version of a MEMS actuator, and then "float" this stage on two separate rail tracks, the first rail track attaching the top MEMS (the AF stage) to an X-axis stage which is itself pushed and pulled along the rail axis, then below this stage there is a 90 degree rotated rail (from the first rail) which attaches the X stage to the Y stage, with the Y-stage then having a push-pull MEMS structure activating the two stages along the second rail. In this approach, the elegant thin form factor of current AF MEMS devices can be "thickened" outside of the critical optical aperture area and still allow for the seating of a lens in relatively close proximity to a sensor (typically only a few millimeters between the back of a lens surface and the front of a sensor surface).

Once a 3-axis arrangement is in place, whether a klunky version or an elegant and thin one, the operation of shifting a sensor in close "tracking" to a light field projected onto that sensor can take place. The specifications of range of motion and response time then become parameters for determining the detailed timing of track and pop imaging. In general, the maximum speed of a MEMS actuation, projected through the focal length of a lens and then onto a scene being imaged, represents the very fastest motion that a scene can move in front of a camera and still be "tracked" by the MEMS motion. Likewise, when a given "tracking" has reached its full motion extent on the MEMS device, a command to end an exposure can take place, then kicking off the "pop" cycle which pops the MEMS actuation back to the other side of its full range. (If a particular MEMS axis represents the "long motion axis" of the current movement of the camera, the other axis will have a "pop" generally not quite as long as its full range).

In such arrangement, individual exposures of "tracked frames" last as long as the full range stroke of the long-motion axis MEMS device. For intuitive grounding of the basic lens and motion parameters, one can imagine a lens with 3.75 mm focal length and a MEMS device with 100 microns full range motion. This gives a projected shift of just about 1.5 degrees, which, if one were to be panning (rotating) a camera operating at 30 frames per second, indicates that objects can move up to 45 degrees per second before they start to have residual blur beyond what the tracking can handle. Those practiced in these arts understand this situation is radically more nuanced than this simple example but the "order of magnitude" of how MEMS' full ranges, response times, focal lengths, etc. all play together is important to intuitively outline. Let us not forget as well that the "pop" phase usually posits turning off the exposing activities of the main sensor as the MEMS actuator(s) pop the sensor back to a new tracking starting point, and thus this "pop" time can represent a significant loss of information gathering if MEMS devices are not manufactured with an eye towards fast (ideally faster than one millisecond) full range popping capabilities. Much slower times can easily be made operational, the cost is simply dead time for light gathering.

Figure 15A:
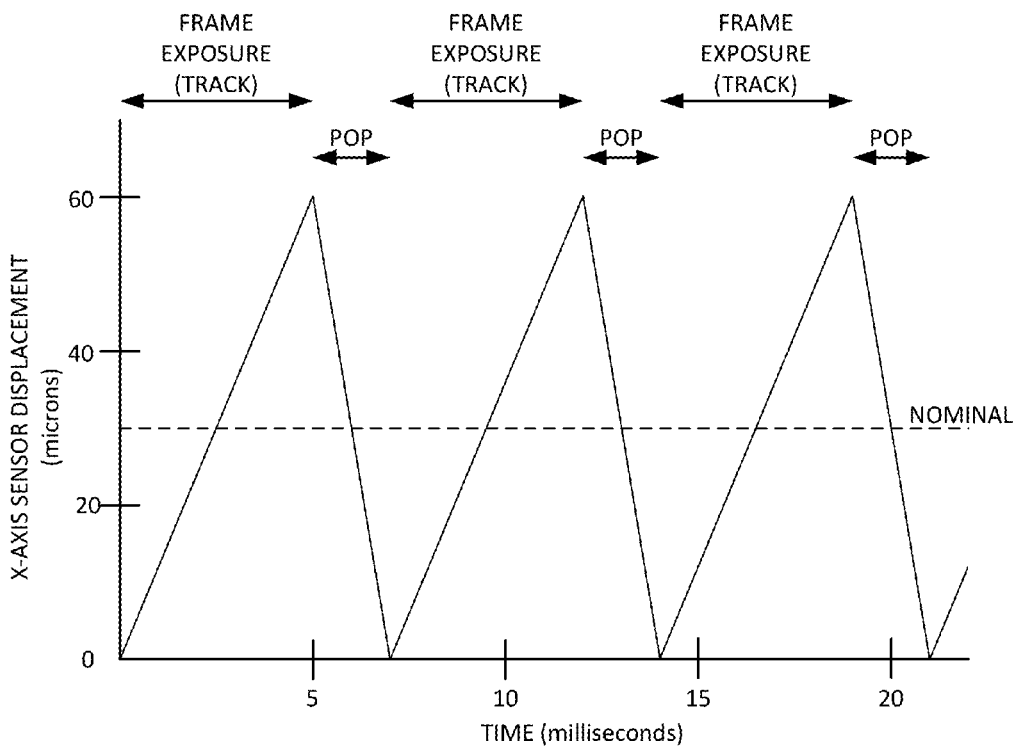
FIGS. 15A and 15B illustrate 2D motion of a smartphone sensor as a function of time.
Figure 15B:
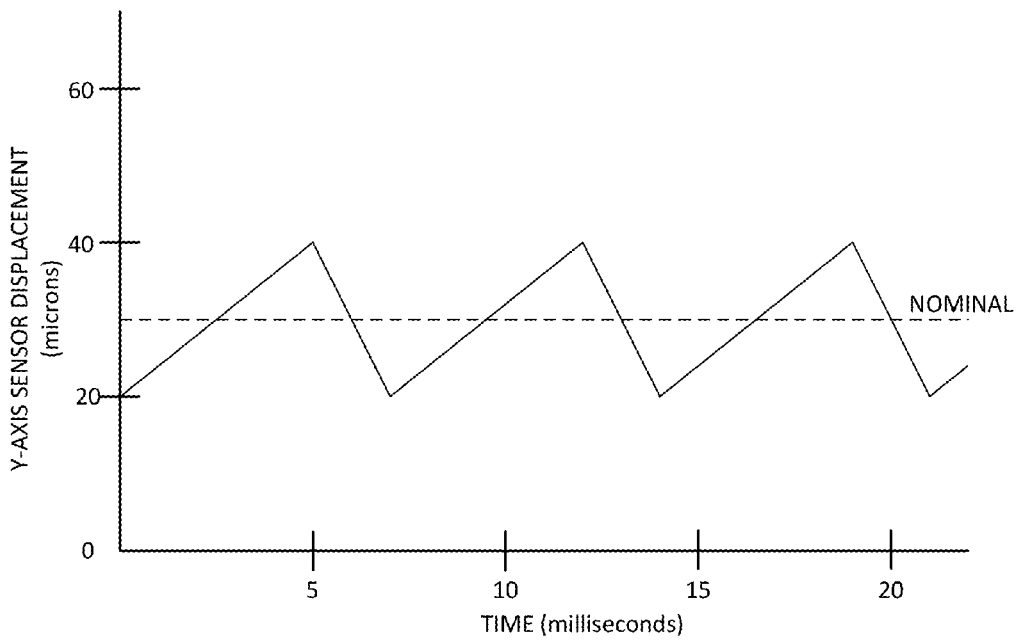
Figure 16:
FIGS. 16 and 17 outline the evolution of imaging systems, culminating with "Era 5"—the subject of the present technology.
Figure 17:
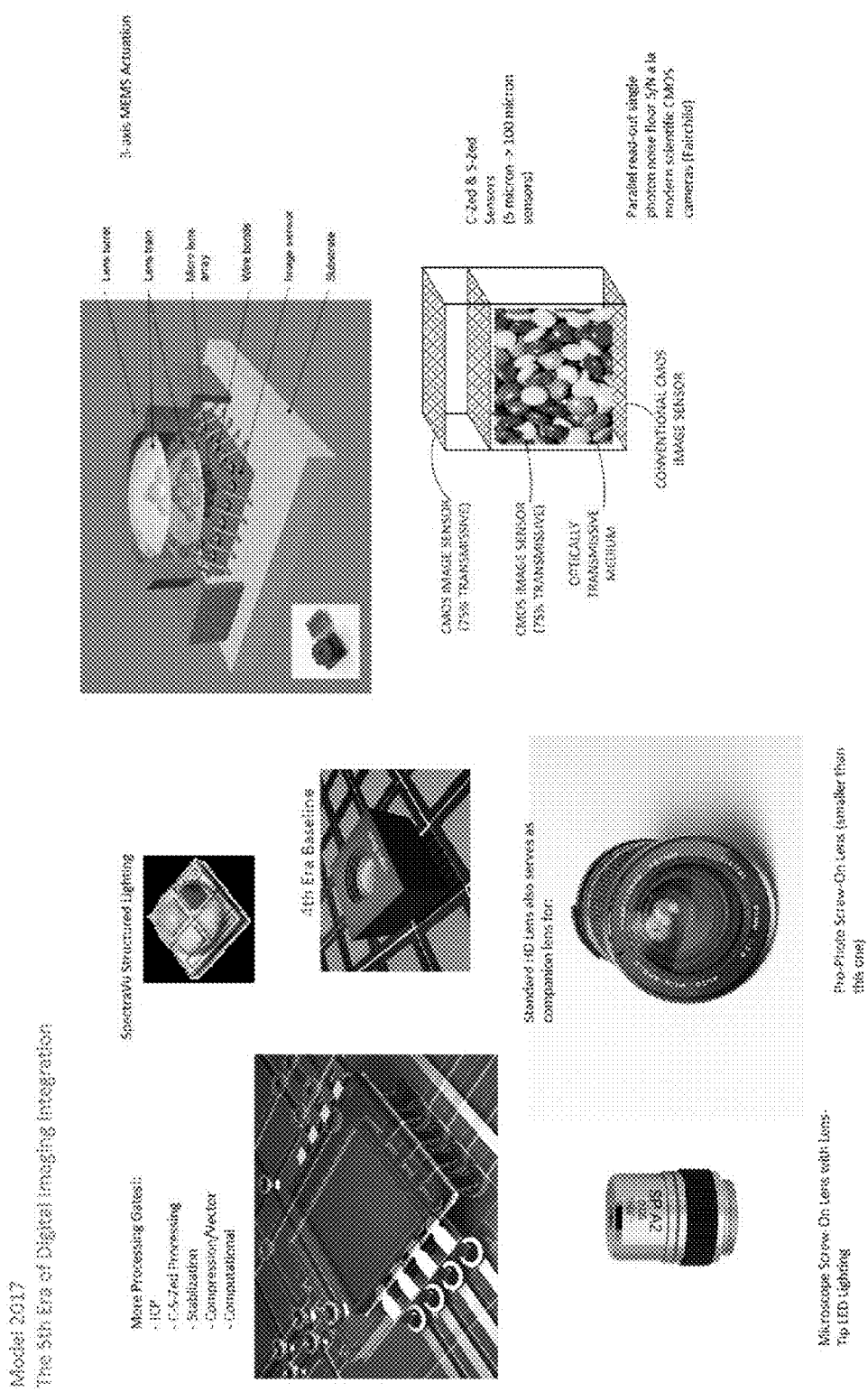

FIGS. 15A and 15B further illustrate the foregoing. Two plots are shown: FIG. 15A shows MEMS actuator displacement of the sensor in the "x" direction, and FIG. 15B is a similar illustration but in the "y" direction. The two actuator waveforms are synchronized, so that the track and pop phases coincide. The "x" actuator travels +/−30 microns around a nominal position (i.e., from 0-60 microns, centered at 30 microns). The "y" actuator is operated to move the sensor a smaller displacement, +/−10 microns around its nominal position. It will be recognized that a single control signal (a timing waveform) can be scaled and offset to generate both the "x" and "y" control signals.

In the illustrated arrangement, the "track" interval (i.e., the frame exposure interval) is 5 milliseconds, and the "pop" interval is 2 milliseconds. Pop intervals that are less than 50% of the track intervals are typically utilized, with more preferable values for the pop interval being less than 20%, 10%, or even less than 5% or 2% of the track interval.

Motion-Stasis-Motion

In accordance with a further aspect of the present technology, an operational mode of the camera is controlled in accordance with a camera gesture. In a particular embodiment, a user signals interest in a scene when a phone is swept along a path to a point where it is briefly held, after which the phone is swept back in a contrary direction. The position at which it is briefly held indicates the user's interest in the scene viewed by the camera from that position.

Data from the phone sensors (accelerometers, gyroscopes, and feature tracking by the camera) are processed to classify the phone as either being in a "motion" phase, or a "stasis" phase. Each phase is characterized by motion parameter thresholds. For example, the "motion" phase may be characterized by any movement at a rate greater than one centimeter per second. (Such velocity can be derived by integrating data from the accelerometer sensor.) Stasis may be characterized by movement at a rate less than 0.5 centimeter per second.

To sense the just-described gesture, the device processor starts by looking for an initial motion phase. When that phase concludes, a time window (e.g., two seconds) starts within which the processor looks for a stasis phase. If stasis is not sensed within that interval (e.g., if the device moves at between 0.5 and 1 cm/second for more than 2 seconds), then the classifier resets—again looking for an initial motion phase.

If a stasis phase is sensed, it must persist for a threshold interval, which may be bounded both by minimum and maximum values. For example, the minimum value may be a value greater than 0.1, 0.2, or 0.5 seconds. The maximum value may be a value less than 1, 2 or 5 seconds. If the device is held in a stasis phase for the required threshold interval, then the process next looks for a retracting motion.

A retracting motion is a second "motion" phase, but one in which the motion is in a direction contrary to the initial motion phase. This can be defined mathematically in various ways, but the concept is familiar: if the user takes the phone from a rest position, sweeps it to a stasis position, and then returns it to (or near) the initial rest position, then that latter motion is a retraction motion.

One algorithmic definition begins by defining a first axis, which is that of a first vector between the device's position at the start of the initial motion phase, and its position at the stasis phase. (The actual path might be curved, but the start and end points define a straight line.) A retraction motion is tested by attributes of a second vector: namely, that between the device's position at the stasis phase, and its position at the end of the second motion phase. If this second vector has a component—when projected onto the first axis—that is larger than its projection onto any axis orthogonal to the first axis, and is in a direction opposite to that of the first vector, then the second motion phase is a retraction motion.

Put another way, if the first motion defines a first direction, then the second motion should have a principle component that is oriented in a direction opposite to that first direction, if the second motion is to be classified as a retraction motion.

Image frames may be captured throughout these phases, at a video capture rate (e.g., 30 frames per second). Or, video capture may commence only after device velocity falls below a threshold, e.g., 1 cm/second (such as at the end of the initial motion phase), and may terminate when the device velocity again rises above that threshold (such as at the beginning of the retraction motion phase).

Data from plural such image frames are combined in known fashion to synthesize one or more enhanced images, e.g., increasing the resolution, or extending the field of view, as contrasted with any single captured image frame. Desirably, two or more such composite images are created (e.g., from different virtual viewpoints), and are presented to the user on the device display. The user can flip or scroll between the composite images, using known image review UI paradigms, and select one or more for long term storage (e.g., in the Photo Library or Camera Roll data structures of the Apple iPhone).

Ideally, the frames of video imagery from which the images presented to the user are composited, are gathered using a sensor of the type earlier described, providing 3D information. In such arrangement, there is no focal plane—outside of which subjects are out of focus. Instead, everything in the composite image is in focus.

Other Comments

It will be recognized that references to transparent materials simply refers to a material that does not block 100% of the light energy of interest. A material that intercepts 99% of the light, and passes 1%, is still regarded as transparent. (If only 0.001% of the light passes, it is no longer regarded as transparent. Between 0.001% and 1% is a range that may or may not be regarded as transparent—depending on the particular application being served.)

While the embodiments of FIG. 3, etc., contemplated that the component image sensors are of the same resolutions, this is not required. In other arrangements the sensors can be of differing resolutions.

The detailed embodiment employs CMOS semiconductor image sensor technology. However, the principles of the detailed arrangement can be applied to any other type of image sensor arrangement, whether presently known (e.g., CCD or organic photosensors) or later developed.

Figure 1:
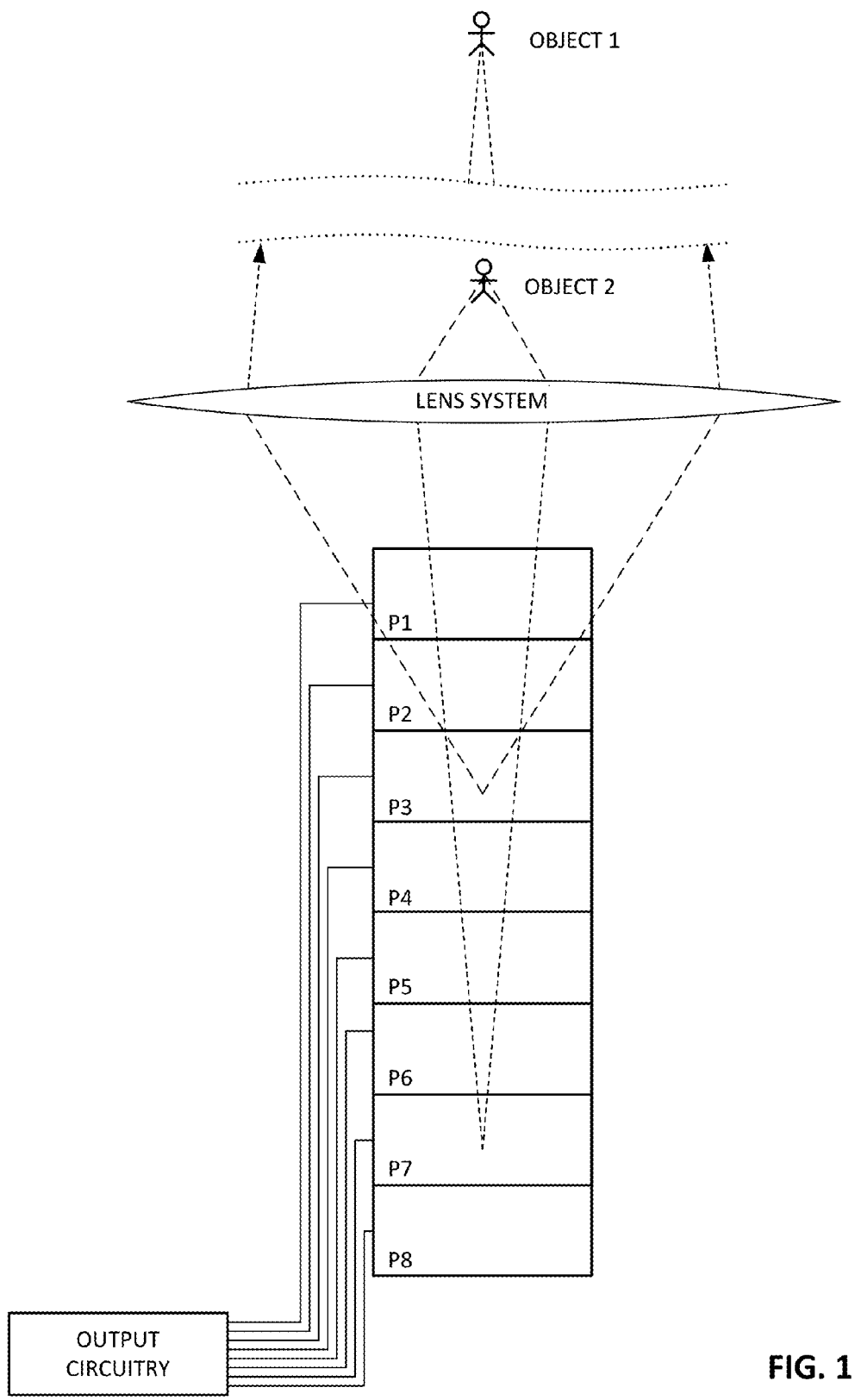
FIG. 1 shows a stack comprising plural photodetectors.

The number of different layers of photosites employed in a particular embodiment is application dependent. Although eight layers are illustrated in FIG. 1, a lesser number (e.g., 3 or 6, etc.) or a greater number (e.g., 9 or 20 or 32, etc.) can be used. If each of the layers is 12 microns in thickness, a stack of eight yields a total stack depth of about 100 microns. A thicker or thinner stack may be desired, depending on the focal length of the lens, and the range of distances from which object images are to be captured. (The stack may be made thicker by increasing the number of photodetectors, or by increasing their component thicknesses.)

The thicknesses of the photosites can be non-uniform, e.g., in acknowledgement that the photon flux deeper in the structure is diminished by photon absorption in higher layers. Alternatively, or additionally, the gains of the corresponding output amplifiers can be non-uniform—with those driven by photosites deeper in the structure having higher gains than those associated with photosites closer to the lens. Still further, the doping of semiconductor structures in deeper photosensors can be different than the doping of corresponding semiconductor structures in higher photosensors.

While a single lens L is shown in FIGS. 1 and 3 for clarity of illustration, it will be recognized that plural lenses can be used, e.g., a compound lens, or a lens for each pixel, or a lens per group of neighboring pixels, etc. Combinations can also be used, e.g., a single object lens, in conjunction with a plurality of microlenses, as is known in certain light field architectures.

The details of the photodetectors, and their respective charge accumulation, latching, switching and reset circuitry are not detailed, as same are within the skills of the artisan in photosensor design.

Applicant's published applications 20110212717, 20110161076, and 20120284012, and pending application Ser. No. 13/750,752, filed Jan. 25, 2013, detail methods and arrangements that are useful in combination with the present technology. Publication 20110212717, for example, teaches that post-processing of sensor data is desirably performed by processing circuitry on the same substrate as the sensing elements. In the present case, such processing circuitry can take the raw signals from the various sensors/photosites, and process them to produce data streams optimized for their intended use (e.g., one data stream optimized for rendering to a user on a screen, another optimized for recognizing text from close focal distances, etc.).

It will be recognized that multiple features are taught by this specification, and different particular embodiments have been detailed that combine different of these features. However, it will be recognized that the features can be combined in myriad arrangements, too numerous to catalog. This disclosure should be regarded as teaching all combinations of the disclosed features.

To provide a comprehensive disclosure without unduly lengthening this specification, applicant incorporates by reference the documents identified herein, as well as the documents they respectively reference. All such documents are incorporated in their entireties, as if fully set forth herein.

Review

A far-from-complete list of some of the inventive arrangements provided by this technology includes the following:

An optical array sensor for use with a lens, where the sensor comprises a structure having a thickness of at least 10 microns, with plural photo-electron generating regions (photosites) dispersed at differing layers within that thickness (corresponding to differing lens focal planes). A particular such sensor is useful for sensing objects at distances from the lens ranging from less than ten inches, out to infinity.

In some such sensors, the photosites are spectrally selective, and there are at least two different types of spectral selection. Commonly there may be four or more. Desirably, the photosites are transmissive to light for non-spectrally-selected wavelengths of light.

In a particular sensor, the structure has a thickness of more than 50 microns, comprises three or more different layers of photosites. These three layers correspond to objects imaged at respective distances of (a) less than 10 inches, (b) between ten inches and three feet, and (c) greater than three feet.

The above-noted sensor may be provided with a first CMOS sensor array atop said structure, which serves as an entry surface onto which light entering the structure is first incident. This CMOS sensor array may pass 25% or more of the visible incident light into said structure.

Similarly, the above-noted sensor may be provided with a second CMOS sensor array behind the structure, for receiving light that was not transduced to photo-electrons elsewhere in the sensor.

In some arrangements, both of the just-referenced CMOS sensors are provided, thereby sandwiching the structure. In such a configuration, a first fraction of incoming light is transduced to electrons by the first CMOS sensor atop the structure, another fraction of incoming light is transduced to electrons by the photosites in the structure, and a further fraction of the incoming light is transduced to electrons by the second CMOS sensor behind the structure.

In another particular sensor, there are at least four differing depth layers for the photo-electron generating regions in the structure. Each of these regions comprises plural photosites, and an X-Y arrangement of the photosites in one of said layers is staggered relative to an X-Y arrangement of the photosites in a successive layer.

The just-described sensor may have a density of photosites such that 25% or less of incident light reaches a CMOS sensor array at the back of the structure.

The above-noted sensors may include photosites arranged such that a line normal to the thickness passes through a first photosite in one layer and a second, different photosite in a different layer. These first and second photosites are desirably differently spectrally selective.

The above-noted sensors can include a first gated conduction path that couples a first photosite to a first transfer capacitor, and a second gated conduction path that couples a second photosite to a second transfer capacitor, where the first and second transfer capacitors are optically shielded from incident light.

Such a sensor can further include control circuitry for alternately gating the conduction paths on and off plural times per second, to produce raw video signal charge streams to the transfer capacitors.

The technology also includes an apparatus having a stack of plural photodetectors $P_1$-$P_N$ and a lens. The lens introduces light onto a first exterior surface of the stack, for passage through the stack towards a second exterior surface of the stack. The stack positions different of the photodetectors at different distances from the lens, so that they provide dominant responses to light captured from objects at different distances from the lens in accordance with the photodetectors' distances from the lens. A distance between photodetectors $P_1$-$P_N$ in the stack is at least 20 microns.

Another such sensor includes four or more light-detecting volumes $P_1$, $P_2$, $P_3$-$P_N$ arranged so that light detected in volume $P_2$ has first passed through volume $P_1$, light detected in volume $P_3$ has first passed through volumes $P_1$ and $P_2$, etc. A distance between volumes $P_1$-$P_N$ is at least 20 microns, permitting the sensor to provide object distance information when used with a lens that directs light from an object onto the sensor.

In the just-detailed sensor, the light-detecting volumes can be arranged in a stack along a stack axis. A first of the volumes has a first photosensitive region, and a second of said volumes has a second photosensitive region. A line between centers of these first and second photosensitive regions is not parallel to said stack axis.

Put another way, if the light-detecting volumes are arranged in a stack along a Z axis in an X, Y, Z Cartesian coordinate system, each of the light-detecting volumes each has an extent in X-Y space. In such view, a first of the volumes has a photosensitive region at a first X-Y location, and others of the volumes have respective photosensitive regions at other X-Y locations that are different than the first X-Y location. In such an arrangement, a light ray traveling through the sensor parallel to the Z axis encounters different of said photosensitive regions, depending on the ray's location in X-Y space.

The invention claimed is:

1. Apparatus comprising an optical array sensor for use with a lens, the sensor comprising a structure having a vertical thickness of at least 10 microns, with plural photo-electron generating regions dispersed at two or more layers within that thickness, said layers corresponding to differing lens focal planes, two of said plural photo-electron generating regions being vertically separated by at least 10 microns, wherein each of the photo-electron generating regions comprises an array of plural photosites, each photosite in a first layer corresponding to a photosite in a second layer, thereby defining corresponding pairs of photosites, the apparatus further including circuitry that adds output signals from corresponding pairs of photosites in the first and second layers to yield output data for a single pixel, and including circuitry that scales output signals from one of said layers before said signals are added with signals from another of said layers, to account for different light intensity incident on said first and second layers, wherein the apparatus yields a frame of output pixel data that exhibits a contrast sensitivity function with two or more relative maxima as a function of distance to a subject.

2. The apparatus of claim 1 in which each photosite in a first layer corresponds both to a photosite in a second layer and to a photosite in a third layer, thereby defining corresponding triples of photosites, the apparatus further including circuitry that adds output signals from corresponding triples of photosites in the first, second and third layers to yield output data for a single pixel, wherein the apparatus yields a frame of output pixel data that exhibits a contrast sensitivity function with three or more relative maxima as a function of distance to a subject.

3. The apparatus of claim 1 wherein said structure includes first and second planar arrays of photodetectors, said first and second planar arrays being vertically separated by at least 50 microns, wherein the sensor is useful for sensing objects at distances from the lens ranging from less than ten inches, out to infinity.

4. The apparatus of claim 1 wherein the photo-electron generating regions are spectrally selective and there are at least four different types of spectral selection.

5. The apparatus of claim 1 wherein said structure has a vertical thickness of more than 50 microns, and the sensor comprises three or more photo-electron generating regions at said differing layers, the three regions corresponding to objects imaged at respective distances of (a) less than 10 inches, (b) between ten inches and three feet, and (c) greater than three feet.

6. The apparatus of claim 1 that further includes a first CMOS sensor array atop said structure, serving as an entry surface onto which light entering the structure is first incident, said first CMOS sensor array passing at least 25% of visible incident light into said structure.

7. The apparatus of claim 6 that further includes a second CMOS sensor array at a bottom of said structure, said first and second CMOS sensor arrays thereby sandwiching the structure, wherein a first fraction of incoming light is transduced to electrons by the first CMOS sensor atop the structure, and a second fraction of the incoming light is transduced to electrons by the second CMOS sensor behind the structure.

8. The apparatus of claim 7 in which a third fraction of the incoming light is transduced to electrons by photo-electron generating regions in the structure between the first and second CMOS sensor arrays.

9. The apparatus of claim 1 that further includes a CMOS sensor array at a bottom of said structure, for receiving light that was not transduced to electrons elsewhere in the sensor.

10. The apparatus of claim 9 wherein there are at least four differing depth layers for the photo-electron generating regions in the structure, each of the photo-electron generating regions comprising plural photosites, wherein an X-Y arrangement of the photosites in one of said layers is staggered relative to an X-Y arrangement of the photo sites in a successive layer, and wherein a density of the photosites is such that 25% or less of incident light reaches the CMOS sensor array at the bottom of said structure.

11. The apparatus of claim 1 wherein there are at least four differing depth layers for the photo-electron generating regions in the structure, each of the photo-electron generating regions comprising plural photosites, wherein an X-Y arrangement of the photosites in one of said layers is staggered relative to an X-Y arrangement of the photosites in a successive layer.

12. The apparatus of claim 1 in which each of the photo-electron generating regions comprises plural photosites, and a line along a vertical axis passes through a first photosite in one layer and a second, different photosite in a different layer, said first and second photosites being differently spectrally selective, the sensor further including a first gated conduction path coupling the first photosite to a first transfer capacitor, and a second gated conduction path coupling the second photosite to a second transfer capacitor, the first and second transfer capacitors being optically shielded from incident light.

13. The apparatus of claim 1 in which at least one of said photosites is positioned vertically above a thin film-based frequency-selective mirror, wherein if a quantum of light passes said photosite without dislodging a photo-electron, it next encounters the thin film structure, which reflects light of certain frequencies back towards the photosite, giving this quantum of light a second chance to be sensed by said photosite.

14. The apparatus of claim 1 comprising at least four photo-electron generating regions, at four different respective layers within the vertical thickness, said four layers defining first, second and third spacings between successive layers, wherein said first, second and third spacings are each different.

15. The apparatus of claim 14 in which at least one of said photo-electron generating regions comprises a photosite positioned vertically above a thin film-based frequency-selective mirror, wherein if a quantum of light passes said photosite without dislodging a photo-electron, it next encounters the thin film structure, which reflects light of certain frequencies back towards the photosite, giving this quantum of light a second chance to be sensed by said photosite.

16. The apparatus of claim 1 in which at least one of said photo-electron generating regions includes a photosite positioned vertically above a thin film-based frequency-selective mirror, wherein if a quantum of light passes the photosite without dislodging a photo-electron, it next encounters the thin film structure, which reflects light of certain frequencies back towards the photosite, giving this quantum of light a second chance to be sensed by said photosite.

17. Apparatus comprising an optical array sensor for use with a lens, the sensor comprising a structure having a vertical thickness of at least 10 microns, with plural photo-electron generating regions dispersed at two or more layers within that thickness, said layers corresponding to differing lens focal planes, two of said plural photo-electron generating regions being vertically separated by at least 10 microns, wherein each of the photo-electron generating regions comprises an array of plural photosites, each photosite in a first layer corresponding to a photosite in a second layer, thereby defining corresponding pairs of photosites, the apparatus further including circuitry that adds output signals from corresponding pairs of photosites in the first and second layers to yield output data for a single pixel, wherein the apparatus yields a frame of output pixel data that exhibits a contrast sensitivity function with two or more relative maxima as a function of distance to a subject, and wherein a photo-electron generating region closest to the lens comprises fewer photosites responsive to one of red, green or blue light than a photo-electron generating region furthest from the lens.

18. Apparatus comprising an optical array sensor for use with a lens, the sensor comprising a structure having a vertical thickness of at least 10 microns, with four or more photo-electron generating regions dispersed at four or more layers within that thickness, said layers corresponding to differing lens focal planes, two of said plural photo-electron generating regions being vertically separated by at least 10 microns, wherein each of the photo-electron generating regions comprises an array of plural photosites, each photosite in a first layer corresponding to a photosite in a second layer, thereby defining corresponding pairs of photosites, the apparatus further including circuitry that adds output signals from corresponding pairs of photosites in the first and second layers to yield output data for a single pixel, wherein the apparatus yields a frame of output pixel data that exhibits a contrast sensitivity function with two or more relative maxima as a function of distance to a subject, and wherein said photo-electronic generating regions are at four different respective layers within the vertical thickness, said four layers defining first, second and third spacings between successive layers, wherein said first, second and third spacings are each different.

19. Apparatus comprising an optical array sensor for use with a lens, the sensor comprising a structure having a vertical thickness of at least 10 microns, with plural photo-electron generating regions dispersed at two or more layers within that thickness, said layers corresponding to differing lens focal planes, two of said plural photo-electron generating regions being vertically separated by at least 10 microns, wherein each of the photo-electron generating regions comprises plural photosites, and a photo-electron generating region closest to the lens comprises fewer photosites responsive to one of red, green or blue light than a photo-electron generating region furthest from the lens.

20. The apparatus of claim 19 comprising at least four photo-electron generating regions, at four different respective layers within the vertical thickness, said four layers defining first, second and third spacings between successive layers, wherein said first, second and third spacings are each different.

21. The apparatus of claim 19 in which at least one of said photosites is positioned vertically above a thin film-based frequency-selective mirror, wherein if a quantum of light passes said photosite without dislodging a photo-electron, it next encounters the thin film structure, which reflects light of certain frequencies back towards the photosite, giving this quantum of light a second chance to be sensed by said photosite.

\* \* \* \* \*